Inventor
Pierre J. F. Deman
by Michael S. Striker
Atty

April 29, 1969 P. J. F. DEMAN 3,441,861

SELF-TUNING FILTER SYSTEM

Filed Jan. 18, 1966 Sheet 2 of 4

Inventor
Pierre J. F. Deman
by
Michael J. Striker
Atty

Inventor
Pierre J. F. Deman
by
Michael J. Striker
Attorney

Inventor
Pierre J. F. Deman
by Michael J. Striker
Atty

United States Patent Office 3,441,861
Patented Apr. 29, 1969

3,441,861
SELF-TUNING FILTER SYSTEM

Pierre J. F. Deman, Paris, France, assignor to Compagnie Francaise Thomson Houston-Hotchkiss Brandt, Paris, France, a corporation of France Filed Jan. 18, 1966, Ser. No. 521,455
Claims priority, application France, Jan. 21, 1965, 2,785
Int. Cl. H03b *1/04;* H03k *1/10*
U.S. Cl. 328—165 14 Claims

ABSTRACT OF THE DISCLOSURE

A self-tuning filter system comprising a plurality of tuned circuits connected to receive a common input signal and having respective resonance frequency values, a plurality of gates having signal inputs connected to the outputs of respective tuned circuits and having gating inputs, threshold detector means, and means selectively interconnecting the outputs of the threshold detector means with the gating inputs.

It is an object of this invention to provide an improved filter network of the active, self-tuning type, that will spontaneously alter its passband characteristics in response to variations in the frequency characteristics of an input signal applied to it.

The signal-to-noise ratio in a communication system, such as an amplitude- or frequency-modulation receiver, is directly dependent on the passband of the filtering networks in the system. The elimination of noise and spurious signals requires that the passband be as narrow as is consistent with the transfer of all the useful components in the input signal. However, the basic frequency characteristics of the input signal itself may change during transmission, for example due to carrier frequency drift or for various other causes. If therefore the filter passband remains unchanged at an initial narrow value, all of the modulation and other useful frequency components in the input signal may not be passed, and distortion will be introduced. This problem is especially serious in frequency-modulation receivers because of the broad frequency bands involved.

Self-tuning filter networks have already been proposed, but have not been generally satisfactory. In one type of prior self-tuning filter, a set of tuned circuits provided with variable attenuation means was used. Such a network has a very limited range of self-tuning adjustment, and is therefore of limited usefulness. In another prior proposal, there is provided a plurality of complete four-pole filter networks selectively switchable in and out of circuit while carrying substantial fractions of the total signal energy. In such a system the self-tuning range can be quite broad, but the switching of the filter units under considerable load has introduced so much noise and distortion as to impose severe limits on the practical energy level of the input signal and render the system unsuitable for many applications.

Objects of the present invention include the provision of a self-tuning filter system which possess all or part of the following advantages. It shall have a broad self-tuning capacity. It will have a large number of frequency channels each including a simple, single-pole resonant or tuned circuit passing a relatively small amount of the total signal energy, and the switching in and out of the frequency channels will primarily involve those marginal channels that are passing the smaller amounts of the total signal energy, thereby minimizing the noise and distortion introduced by the switching operations. Further, the improved network will be able simply and efficiently to handle continuous variations in the frequency characteristics of the input signal, and will hence be highly suitable for use in analog information handling systems, as well as digital systems. In accordance with an important further object of the invention, the improved network embodies logical means determining the bandpass characteristics thereof for a given set of input signal frequency characteristics, in accordance with a desired logical pattern, and further, this logical pattern itself may be made to vary in dependency on some controlling factor, such as the rate of frequency variation in the input signals, and/or other factors. These features greatly enhance the flexibility and versatility of the improved system.

The above and further objects and advantages and the novel features of the invention will become apparent from the ensuing exemplary description of an illustrative embodiment and some modifications shown in the accompanying drawings, wherein.

Figure 1:
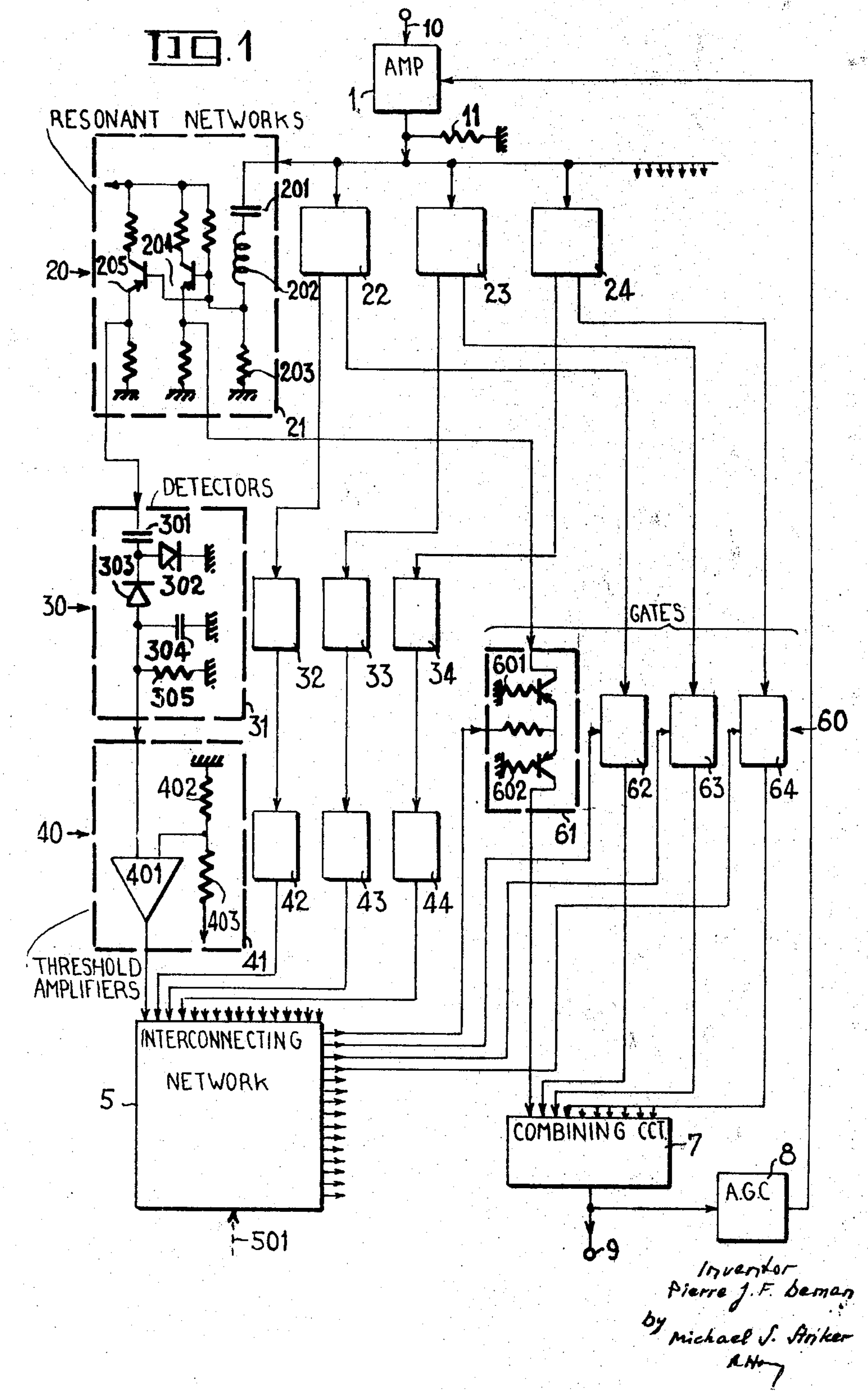
FIG. 1 is a general functional diagram of the invention, with one of the frequency channels being expanded to show the electric circuits in the main components thereof.

The self-tuning filter network illustrated in FIG. 1 has an input terminal 10 adapted to receive an input signal, such as the output from an intermediate-frequency amplifier stage in a conventional frequency-modulation receiver, not shown.

The input signal is fed from input terminal 10 to a variable-gain amplifier 1 of conventional type. Amplifier 1 is shown as having a gain-varying input connected by way of an automatic gain control circuit 8 with the output terminal 9 of the system. While the provision of an AGC loop of the general character here shown is considered desirable in accordance with the invention, it should be understood that such AGC loop may be connected to vary the gain of some previous amplifying stage of the general system to which the invention is applied, such as a higher-frequency amplification stage, not here shown.

The input amplifier 1 is provided with low output impedance means, as is required for the excitation of the resonant circuits presently described. Such low output impedance is here schematically indicated as a resistor 11, which may be only a few ohms in value, connected between the output of amplifier 1 and ground.

The system includes a plurality of generally similar tuned or resonant circuits 20 all having their inputs connected in parallel to the output of amplifier 1. Only the four tuned circuits 21, 22, 23, 24 are indicated in FIG. 1 but actually many more would be provided. The tuned circuits 20 used in the invention are single-pole tuned circuits of the type having a transfer function of the form $$\frac{1}{1+jQ\frac{F-F_o}{F_o}}$$

where Q represents the circuit —Q and $F_0$ the tuning frequency. Single-pole tuned circuits of this type are disclosed e.g. in Reference Data for Radio Engineers (4th edition), page 237, FIG. 1, diagram A. In a circuit of this type, the phase shift sustained by an input sinewave signal does not exceed ±90°. The tuned circuits 20 are provided with different center resonant frequency values which are spaced, preferably uniformly, over the full frequency range which the system is to handle, and the individual circuits may have similar pass bands which preferably overlap, so that said full range is effectively covered. For example in one embodiment, there may be used fourty tuned circuits in parallel, having their resonant mid-frequency values in an arithmetical progression of ratio 1000 c.p.s., and frequency bands (at 3 db power gain) of slightly less than 1000 c.p.s. each, so as to cover an overall range of 40 kilocycles.

The tuned circuits 20 are each advantageously constructed in the manner shown for circuit 21. The circuit has a series-resonant line including an input capacitance 201 (to which the input signal is applied from amplifier 1), followed by an inductance 202 followed by a resistance 203 connected to ground. The circuit further includes two isolating transistors 204 and 205 whose bases are symmetrically connected to the junction of inductor 202 and resistor 203 and whose emitters serve to derive two separate outputs from the circuit. Suitable bias is applied to the base and collector of each transistor 204, 205 by way of the resistors shown, and load resistors connect the emitters to ground, all in accordance with standard transistor circuit practice.

The "single-pole" type of resonant circuit such as 21 is considered especially desirable, but various other equivalent circuits may be used, including conventional inductance-capacitance resonant filters and crystal oscillators in which means are provided for compensating the parallel resonant component and thereby rendering the filter substantially equivalent to a single-pole series resonator. The circuit constants are selected to provide the desired resonance peak and overlap between the resonance curves of adjacent circuits such as 21, 22, 23, . . . as indicated above, in order to minimize the fluctuations in the over-all output response curve of the system. Further, the phase response of each resonator circuit 20 is preferably made approximately linear. This may be done in any of various conventional ways, as disclosed e.g. in French Patent 1,354,860. For example, adjustable phase shifters may be connected in series with the respective tuned circuits to improved linearity of phase response. The circuit shown at 21 in FIG. 1 has the further advantage that the separator or isolating transistors 204, 205 ensure that the series resonant circuit retains a substantially constant output impedance as determined by resistance 203.

One of the outputs of each resonant circuit 20 is applied to an associated detector circuit 30, the respective detector circuits being designated 31, 32, 33, . . . Each detector circuit 30, as shown for circuit 31, may include an input capacitor 301 with diodes 302 and 303 reversely connected thereto in a voltage doubler arrangement. Diode 302 has its free terminal connected to ground and diode 303 has its free terminal providing the detected output. A smoothing filter comprising capacitance 304 and resistance 305 in parallel is connected across said output and ground, and establishes a time constant for the detector circuit.

The output from each detector such as 30 is applied to an associated threshold amplifier circuit 40, these circuits being designated 41, 42, 43, 44, . . . Each threshold amplifier circuit, as shown for circuit 41, may include a conventional astable amplifier schematically indicated as 401 having a threshold adjusting input derived from a voltage divider formed by the resistances 402 and 403, preferably adjustable to adjust the threshold voltage that the circuit will pass in amplified form. It will thus be evident that each pair of series-connected circuits such as 31–41, 32–42, . . . constitutes a threshold detecting circuit arrangement. This arrangement is operative to deliver an amplified direct voltage at the output of that threshold amplifier, or each of these threshold amplifiers, whose related tuned circuit 20 has passed more than a prescribed amount of the energy content of the input signal applied at 10.

The outputs from all of the threshold amplifier circuits 40 are applied to the related inputs of an interconnecting network generally designated 5. Network 5 has outputs corresponding in number to the number of its inputs, i.e. the number of frequency channels in the system. The network 5 is so arranged that, on energization of a particular one of its input lines, a voltage appears on a number of the output lines that are related in a determined logical pattern to the particular output line corresponding with the energized input line. Specific examples of the construction of logical interconnecting device 5 will be given later. For the understanding of the present disclosure, it may be assumed that the logical interconnecting device 5 is so designed that the energization of any one of its input lines, say input line Nr. $n$, causes the energization of five of the output lines of the device, specifically output lines Nr. $(n-2)$, Nr. $(n-1)$, Nr. $n$, Nr. $(n+1)$ and Nr. $(n+2)$.

The output lines from device 5 are applied as gating inputs to respective gate or switch circuits 60, designated 61, 62, 63, . . . . Each gate has a signal input connected to the second output of a related one of the tuned circuits 20, and has an output connected as a respective input to a common signal combining or mixing circuit 7. The combining circuit 7 has an output connected to the system output terminal 9 and applies thereto the sum of the signals applied to its inputs.

The gates 60 may assume any of various well-known forms. As here shown, each gate circuit comprises a pair of transistors 601 and 602 connected in a common emitter circuit, with the gate input signal from the related resonator 20 being applied to the collector of transistor 601 and the output to mixer 7 being taken from the collector of transistor 602, while the common emitter junction constitutes the gating input connected to a related output line of logical network 5.

The combining or mixing circuit 7 is of a well-known type having suitable impedance means therein for decoupling the signals applied to the respective mixer inputs from one another.

In operation, it is assumed in this example that the input signal applied to input terminal 10, is an amplitude- or a frequency-modulated I-F signal, having a relatively low modulating index and a correspondingly high carrier energy, with a total frequency band of somewhat less than 5 kilocycles. This signal, therefore, will induce substantial resonance in five of the tuned circuits 20, with the highest resonant energy being produced in that tuned circuit whose centre frequency is closest to the carrier frequency of the signal, but appreciable resonance being likewise present in the two resonators immediately below and the two immediately above it, in the series. The threshold value of the amplifier circuits 40 is so adjusted, by means of the voltage dividers such as 402–403, that in conjunction with the adjustment of the AGC device 8, only that threshold amplifier 40 in the particular frequency channel whose resonator 20 substantially corresponds in resonant frequency to the signal carrier frequency produces an output. This output is applied to the single associated one of the input lines of logic device 5. The device 5 operates in a manner presently described in detail to have five of its output lines energized, the particular output line corresponding with the energized input line, and the two pairs of output lines immediately below and immediately above it. These five outputs are applied to the gating inputs of the corresponding gate circuits 60, which thereupon pass to the combining circuit 7 the outputs from the two pairs of resonators 20 which together with the first-mentioned resonator corresponding to the signal carrier frequency, cover the entire frequency band of the incoming signal. The mixer 7 then applies to the filter output terminal 9 the resultant of all the passed frequency components of the signal.

The AGC feedback loop including the device 8 acts at all times to maintain the amplitude of the input signal at a level just high enough to ensure that the prescribed threshold circuit 40 is operated, regardless of possible variations in input level.

Figure 2:
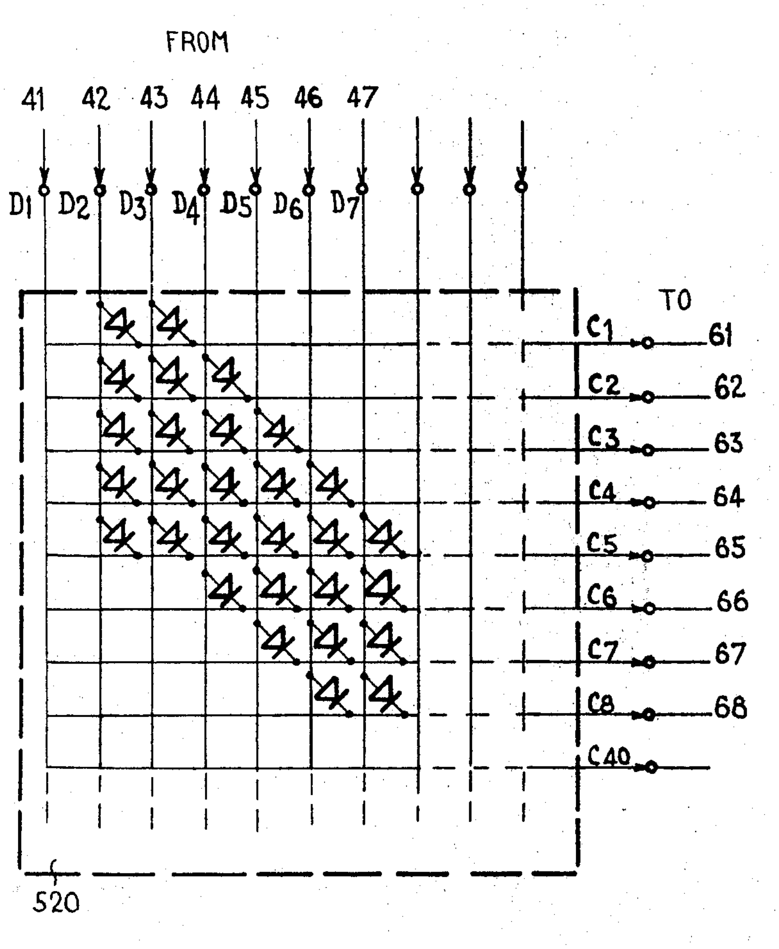
FIG. 2 illustrates one form of matrix network usable as the logical interconnecting means in the system of the invention.

FIG. 2 illustrates a suitable construction of the interconnecting device 5 usable for the type of operation just described. As shown, the device 5 is in the nature of a matrix network 520 wherein each input line D extending from a related threshold amplifier circuit 40 is connected by way of five diode devices in parallel with five associated ones of the output lines C (extending to the gating inputs of the respective gates 60). Specifically, every input line having the serial number $n$ (disregarding the first two input lines D1 and D2) is connected by way of five respective diodes to the output line having the same serial number $n$, and to the output lines having the serial numbers $(n-2)$, $(n-1)$, $(n+1)$ and $(n+2)$. The first input line D1 is here shown unused, and the second input line D2 is shown connected through its associated diodes with the same five output lines as the third input line D3 is connected. A generally symmetrical arrangement may be provided at the opposite end, not shown, of the matrix.

It will be evident that with the arrangement described with reference to FIGS. 1 and 2, should the carrier frequency of the input signal vary, the system will follow such variations and will at all times and automatically act to reset or recenter the passband through the system so that the center frequency of the output signal constantly corresponds, to within an approximation of 500 c.p.s., with the instantaneous carrier frequency of the input signal and the bandspread of the output signal remains substantially constant at the prescribed 5 kc. s. value.

Figure 3:
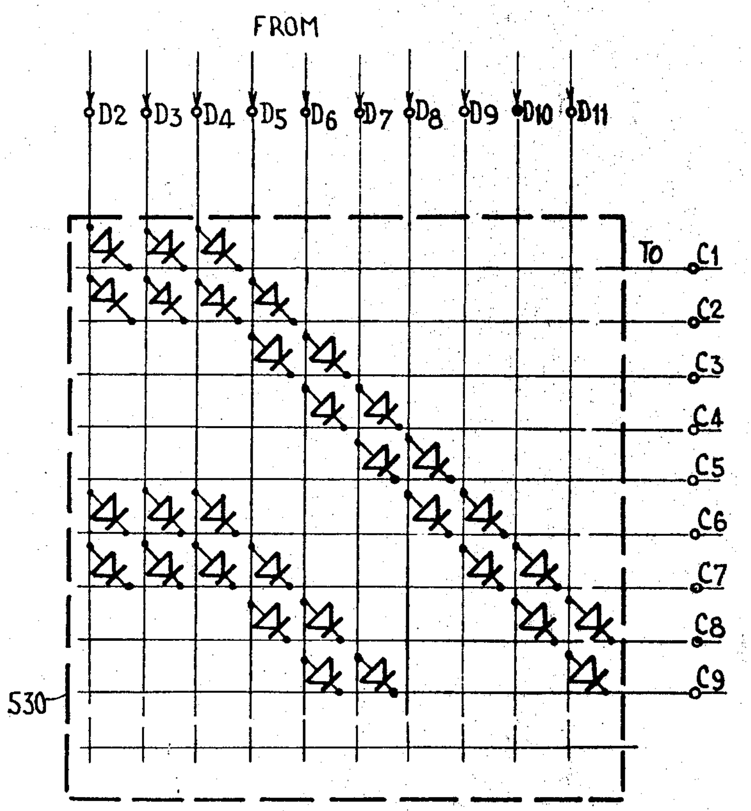
FIG. 3 shows a modified matrix network.

The matrix circuit of FIG. 2 is but one example of the possible logic that may be used for the selective opening of the gates 60 in the respective frequency channels, in accordance with a desired logical pattern. The actual pattern may be varied ad infinitum depending on circumstance. Thus, FIG. 3 shows a corner section of a different matrix circuit generally designated 530. In this instance the diode arrangement is such that (disregarding the connections at the ends of the matrix), an input line D $(n)$ is connected with the output lines C $(n-3)$, C $(n-2)$, C $(n+2)$ and C $(n+3)$. Such an arrangement, clearly, will operate to pass not the main central or carrier frequency of the input signal, but sideband frequencies displaced by determined amounts below and above the central frequency. The arrangement can therefore be used with a carrier-suppressed sideband modulation system.

The number of diodes shown in each of FIGS. 2 and 3 as provided between any input line and the associated output lines connected thereto, is only exemplary. As another practical example, in an arrangement of the general type shown in FIG. 3, applied to an input signal having a base frequency band of from 5 to 15 kc. s., every input line D $(n)$ may be connected through diodes with twenty output lines, say C $(n-15)$, C $(n-14)$, . . . to C $(n-6)$, and C $(n+6)$, . . . to C $(n+14)$, C $(n+15)$.

In the "solid bandpass" arrangement of FIG. 2, the number of output lines with which each input line is connected may likewise be increased or, on the other hand, reduced. As a limiting instance, every input line may be connected to a single corresponding output line, as by providing a simple set of diodes along the main diagonal of the matrix shown in FIG. 2, or directly connecting corresponding input and output lines. Such an arrangement may have utility for keeping the passband of the system at all times centered at the instantaneous carrier frequency of the input signal in the case of high modulation degrees, thereby providing an improved frequency lock or frequency feedback effect. In such cases the time constant of the detector circuits 30, as determined by the capacitance 304 and resistance 305, should be made suitably short, such as less than one millisecond.

While both in FIG. 2 and FIG. 3, the connections between an input line and the output lines of the interconnecting device or matrix were shown as being symmetrical to opposite sides of the input line, this is clearly not indispensable, and asymmetrical interconnecting patterns may be used where desired.

In the interconnecting device 5 as so far described the device has a fixed program which can usually be embodied in a relatively simple matrix network of the general class described above with reference to FIGS. 2 and 3. It is, however, contemplated that more complex logical programs, and ones that may be varied with time, the characteristics of the input signal, and/or other control factors, may be used, requiring the provision of more or less intricate logical networks. As one example, there will be described with reference to FIG. 4 a logical network which operates in response to transients in the input signal for momentarily increasing the passband of the filter system.

Figure 4:
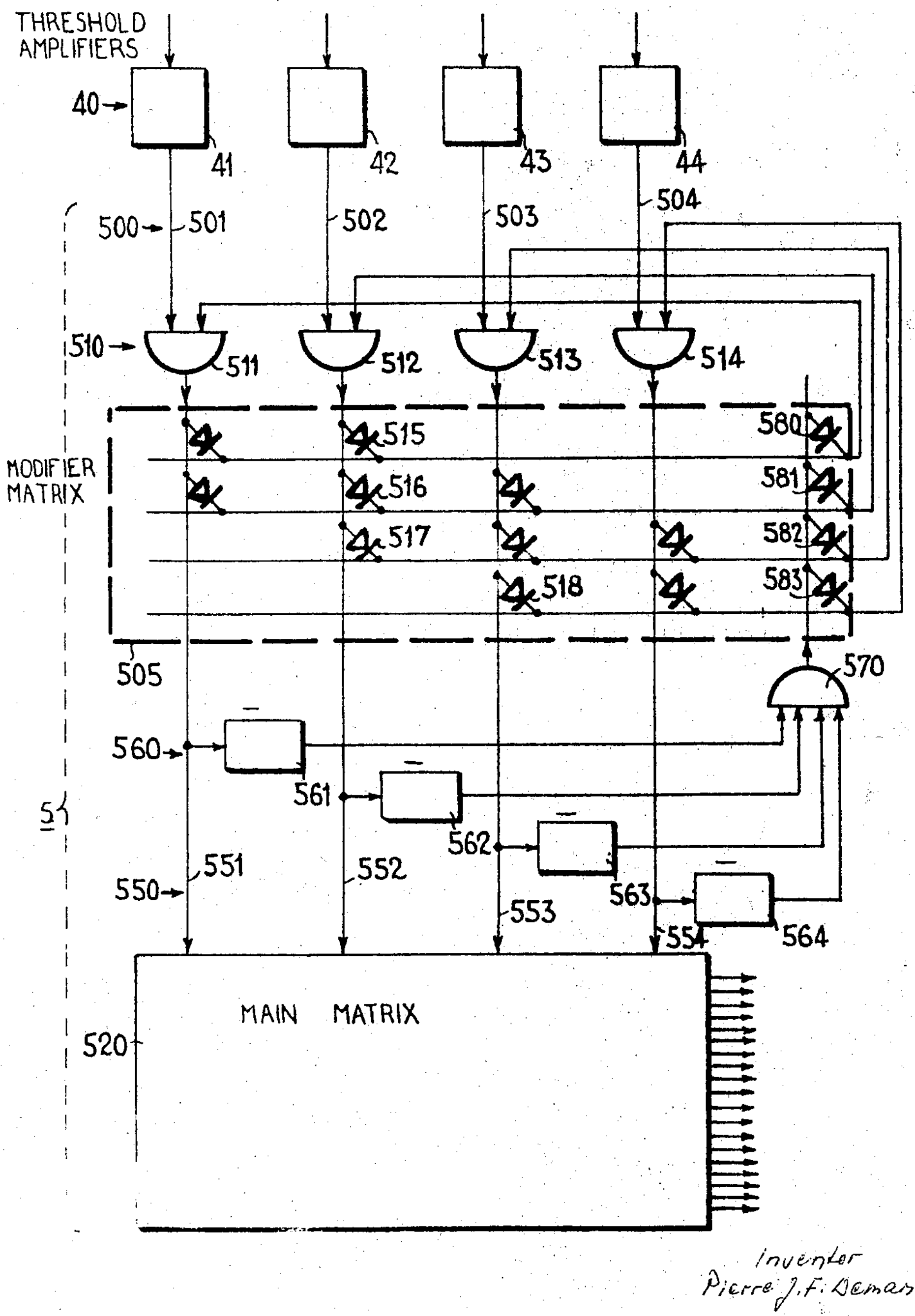
FIG. 4 shows a further modification of the logical interconnecting circuitry which includes a matrix of the general type shown in FIG. 2 and a modifier matrix.

The logical network 5 shown in FIG. 4 includes a matrix 520 of the type shown in FIG. 2 as one component thereof. Connected ahead of matrix 520 to the input lines 550 leading thereto is an auxiliary or modifying matrix generally designated 505. In this modifying matrix, each of the lines 550 (other than those at the initial and terminal ends of the matrix) is connected by way of three diodes, as shown, to a corresponding output line of the modifier matrix, and to the output lines immediately below and above said corresponding output line. The output lines of the modifier matrix 505 are connected to the second inputs of respective and-gates 510 which are interposed in the input lines 500 leading from the respective threshold amplifiers 40 to the modifier matrix 505. Further, the input lines 550 into the main or output matrix 520 are connected to the inputs of respective not-gates or complementing circuits 560, all of which have their outputs fed to a coincidence gate 570. The output of gate 570 is connected by way of respective diodes in parallel, 580 to 583, to the output lines of the modifier matrix 505. This system operates as follows.

In the steady state, when the input signal applied to the filter system has stable frequency characteristics, a single one of the threshold circuits 40, say circuit 42, is delivering an output as earlier described. This output is passed by line 502 through the and-gate 512 whose second input is at this time energized as will presently appear. The signal from and-gate 512 is applied to the corresponding input line 552 of the main matrix 520, which thereupon operates as disclosed with reference to FIG. 2, to energize say five of the matrix output lines, specifically the output line corresponding in number to the energized input line, and two pairs of adjacent output lines.

Simultaneously, the output signal from and-gate 512 is passed by the three diodes 515, 516, 517 in the modifier matrix 505 to the corresponding output lines of said modifier matrix, and thereby applied to the second inputs of the and-gates 511, 512, 513. And-gate 512 is thereby held in its enabled or open state, and the adjacent and-gates 511 and 513 are enabled for a purpose that will presently appear.

It may be explained that the initially assumed enabling of the and-gate 512 (in this example) is due to the action of the not-gates 560. In the initial absence of an output from any one of the and-gates 510, all of said not-gates 560 apply signals to the inputs of coincidence circuit 570, which thereupon emits an output energizing the second inputs of all the and-gates 510. However, when and-gate 512 (in the example) has once passed an output from threshold amplifier 42 to line 552, the related not-gate 562 deenergizes the related input to coincidence gate 570, so that all of the and-gates 510 other than gates 511, 512 and 513, which continue to be enabled in the manner above described, are disabled.

Also, in this embodiment of the invention the detector circuits 30 are provided with an appreciable time constant, say 3 or 4 milliseconds or more, through suitable selection of the capacitance 504 and resistance 505, so that the output from any energized one of the threshold amplifiers 40 is of corresponding duration.

Thus, under the steady-state conditions assumed for the input signal, the system operates in the manner earlier described with reference to FIG. 1. Assume now that the carrier frequency of the input signal is altered, e.g., increased, by more than about 500 c.p.s., at a relatively rapid rate. The threshold circuit 43 now delivers an output and this is passed by and-gate 513 to the input line 553 of main matrix 520. This matrix now operates to energize the output lines associated with this newly energized input, so that the total number of energized output lines now is the logical union of all outputs associated with both the input lines 552 and 553. The passband of the filter system, therefore, is momentarily broadened, and this broadening persists a time determined by the time constant imparted to the detectors 30 as earlier described. It can readily be understood that for a given value of such time constant, the extent of the broadening is substantially proportional to the rate of the frequency change in the occurring transient. The faster the change, the greater the number of main matrix input lines that remain simultaneously energized, and hence the greater the broadening.

This will ensure the proper transfer of rapid transients in the input signal, while affording the desired protection against stray and spurious signals during steady-state conditions.

The logical pattern of interconnections effected by network 5 may be varied in yet other ways. As a further advantageous possibility, there is indicated in FIG. 1 a controlling input 501 connected to network 5 for modifying the pattern of input-output interconnections therein in dependency on an external factor. Such factor may include a selected variable condition of the system of which the invention forms part, and/or a manual adjusting factor. The modifying input 501 may, for example, serve to apply an energizing voltage for enabling a plurality of and-gates (not shown) interposed in series with certain of the diodes of matrix of the type shown in FIG. 2 or FIG. 3, whereby to alter the number and pattern of output lines effectively connectable with each input line of the matrix.

The invention, therefore, is seen to provide an improved active, self-tuning filter network which will operate to maintain at all times the minimum requisite passband characteristics for an input signal regardless of drift and other possible variations in the input signal frequency characteristics. The network can have a self-tuning range that is as broad (or as narrow) as desired. It can be controlled to pass any desired frequency components of an input signal, such as modulation components of any desired character with or without the carrier frequency. As one illustrative application, Doppler shift components in the received signal of a Doppler radar system can be passed regardless of variations in the other frequency characteristics of the signal. The network is inherently suitable for use with input signals of continuously variable frequency characteristics, as used in the transmission of analog information, as well as being suitable for pulsed signals as in digital systems, e.g. in telemetering and other applications.

The use of a plurality of simple tuned circuits of the single-pole series type, as in the preferred embodiment of the invention disclosed, each circuit transmitting a small fraction of the total energy content of the signal, and so arranged that the switching in and out of the circuits only affects marginal frequency channels and hence is performed under low energy loads, ensures that the network, in operation, will only introduce very little noise and distortion as a result of the switching actions. Limitations heretofore imposed on the energy level of the input signal are thus eliminated.

What I claim is:

1. A self-tuning filter system comprising:

a plurality of tuned circuits connected to receive a common input signal and having respective resonance frequency values distributed over a prescribed range;

a plurality of gates having signal inputs connected to the outputs of respective tuned circuits and having gating inputs; threshold detector means connected to receive the outputs of respective tuned circuits and delivering outputs in response to tuned circuit outputs exceeding a determined threshold;

and means selectively interconnecting the outputs of said threshold detector means with said gating inputs; whereby said gates will pass input signal frequency components in prescripted relationship with a main frequency component of the input signal.

2. A system according to claim 1, further including signal combining means connected to receive the outputs of said gates and combine them into an output signal.

3. A system according to claim 2, including a variable-gain device connected for controlling the level of the input signal, and automatic gain control means connected to the output of said combining means and to said variable-gain device for controlling the input signal level in accordance with said output signal.

4. A system according to claim 1, wherein each of said tuned circuits comprises a single-pole resonant circuit having a transfer function of the form $$\frac{1}{1+jQ\frac{F-F_0}{F_0}}$$

where Q is the circuit-Q and $F_0$ the tuning frequency.

5. A system according to claim 1, wherein said threshold detector means comprise rectifier circuits having inputs connected to receive the outputs from respective tuned circuits, and adjustable threshold amplifier circuits connected to receive the outputs from the rectifier circuits.

6. A system according to claim 1, wherein said selective interconnecting means interconnects each of at least some of said threshold detector outputs with more than one of said gating inputs in accordance with a prescribed logical pattern.

7. A system according to claim 6, wherein said selective interconnecting means interconnects each of at least some of said threshold detector outputs with at least one gating input whose associated tuned circuit has a resonance frequency value displaced a determined amount below the resonance frequency value of the tuned circuit associated with said threshold detector output and at least one gating input whose associated tuned circuit has a resonance frequency value displaced a determined amount above the resonance frequency value of the tuned circuit associated with said threshold detector output.

8. A system according to claim 7, wherein said selective interconnecting means further interconnects each of at least some of said threshold detector outputs with the gating input associated with the same tuned circuit as is the threshold detector output.

9. A system according to claim 6, wherein said selective interconnecting means interconnects each of at least some of said threshold detector outputs with the gating input associated with the same tuned circuit as is the threshold detector output, and with a number of gating inputs whose associated tuned circuits have resonance frequency values adjacent to, and respectively lower and higher than, the resonance frequency values of the tuned circuit associated with the threshold detector output.

10. A system according to claim 6, wherein said selective interconnecting means includes unidirectional conductors for effecting said interconnections.

11. A system according to claim 6, wherein said selective interconnecting means includes mean for modifying the logical pattern of interconnection in dependency on an external factor.

12. A system according to claim 6, wherein said selective interconnecting means includes means for modifying the logical pattern of interconnections in dependency on a characteristic of the input signal.

13. A system according to claim 12, wherein the modifying means comprises means responsive to a frequency variation in the input signal for increasing the number of gating inputs interconnected with each of said threshold detector outputs during such variation.

14. A system according to claim 1, including means associated with said threshold detector means for imparting a substantial time constant to the operation thereof.

References Cited

UNITED STATES PATENTS

| | | |
|---|---|---|
| 2,978,655 | 4/1961 | G. L. Fernsler. |
| 3,112,452 | 11/1963 | G. M. Kirkpatrick. |
| 3,315,171 | 4/1967 | F. K. Becker. |
| 3,320,576 | 5/1967 | A. M. Dixon et al. |

KATHLEEN H. CLAFFY, *Primary Examiner.*

C. JIRAUCH, *Assistant Examiner.*

U.S. Cl. X.R.

325—462, 469; 333—17